United States Patent
Mandiram (10) Patent No.: US 11,321,269 B1
(45) Date of Patent: May 3, 2022

(54) DYNAMIC ADDRESS ALLOCATION IN IMPROVED INTER-INTEGRATED CIRCUIT COMMUNICATION

(71) Applicant: NXP B.V., Eindhoven (NL)

(72) Inventor: Ramakrishnan Mandiram, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/247,391

(22) Filed: Dec. 9, 2020

(51) Int. Cl.
| | |
|---|---|
| G06F 13/42 | (2006.01) |
| H03K 17/22 | (2006.01) |
| G06F 1/24 | (2006.01) |
| H03K 3/037 | (2006.01) |
| H03K 5/13 | (2014.01) |
| G06F 12/02 | (2006.01) |

(52) U.S. Cl.
CPC ............ *G06F 13/4291* (2013.01); *G06F 1/24* (2013.01); *G06F 12/02* (2013.01); *H03K 3/037* (2013.01); *H03K 5/13* (2013.01); *H03K 17/22* (2013.01); *G06F 2213/0052* (2013.01)

(58) Field of Classification Search
CPC .............. G06F 13/4282; G06F 13/4291; G06F 2213/0052
See application file for complete search history.

(56) References Cited

U.S. PATENT DOCUMENTS

| | | | |
|---|---|---|---|
| 6,629,172 B1 | 9/2003 | Andersson et al. | |
| 7,587,539 B2 | 9/2009 | Picard et al. | |
| 10,725,949 B2 | 7/2020 | Graif et al. | |
| 11,106,620 B1* | 8/2021 | Mishra | G06F 1/04 |
| 2017/0286358 A1* | 10/2017 | Srivastava | G06F 1/324 |
| 2018/0173667 A1 | 6/2018 | Mishra et al. | |
| 2018/0357199 A1 | 12/2018 | Mishra et al. | |
| 2019/0108149 A1* | 4/2019 | Graif | G06F 13/364 |
| 2020/0159689 A1 | 5/2020 | Koshisaka et al. | |
| 2021/0141757 A1* | 5/2021 | Chakraborty | G06F 1/324 |

OTHER PUBLICATIONS

"Mipi alliance—Errata 01 for MIPI I3C Specification Improved Inter Integrated Circuit Specification Version 1.1", MIPI Alliance, Inc. 494 pgs., retrieved from the Internet at: https://members.mipi.org/wg/All-members/document/80320 (Nov. 27, 2019) (submitted in 6 different parts: 1-100 pgs., 101-150 pgs., 151-200 pgs., 201-300 pgs., 301-400 pgs., 401-494 pgs.).

* cited by examiner

*Primary Examiner* — Zachary K Huson (57) ABSTRACT

Dynamic address allocation of multiple device instances of an improved inter-integrated circuit (I3C) target device by an I3C controller device is disclosed. A first device instance is configured to receive a command and a clock signal from the I3C controller device, and further receive a first status signal that is indicative of a first device instance ID of the first device instance. The first device instance is further configured to decode the command based on the first status signal and the clock signal, and generate a response that includes the first device instance ID. The I3C controller device is configured to allocate a dynamic address to the first device instance based on the response. The first device instance is then configured to generate and provide a second status signal to a second device instance for facilitating dynamic address allocation of the second device instance.

20 Claims, 2 Drawing Sheets

DYNAMIC ADDRESS ALLOCATION IN IMPROVED INTER-INTEGRATED CIRCUIT COMMUNICATION

BACKGROUND

The present disclosure relates generally to electronic circuits, and, more particularly, to dynamic address allocation in improved inter-integrated circuit communication.

Printed circuit boards (PCBs) typically include various devices that communicate with each other by way of a communication interface. One common example of the communication interface is an improved inter-integrated circuit (I3C) interface that adheres to an I3C communication protocol defined by Mobile Industry Processor Interface (MIPI) Alliance. In the I3C communication protocol, an I3C controller device allocates dynamic addresses to I3C target devices for establishing communication therewith. To allocate the dynamic addresses to the I3C target devices, it is required for each I3C target device to be uniquely identifiable. Hence, in the I3C communication protocol, each I3C target device has a unique provisional identifier (ID) associated therewith. The provisional ID is typically of 48 bits, and includes a 15-bit manufacturer ID, a 1-bit part ID, a 16-bit device ID, a 4-bit device instance ID, and a 12-bit version ID. Thus, the I3C controller device allocates a unique dynamic address to each I3C target device based on the corresponding provisional ID.

When multiple device instances of an I3C target device are implemented on the PCB, the device instance ID of each device instance varies, thereby rendering the corresponding device instance unique. Typically, such device instance IDs are allocated to the corresponding device instances after an initialization of the I3C interface. To facilitate such an allocation in the I3C communication protocol, four dedicated pins are reserved on each device instance. Such pins, however, result in an increase in a size and a manufacturing cost of each device instance. The increase in the size and the manufacturing cost of each device instance leads to an increase in a size and a manufacturing cost of a PCB including such device instances, respectively. Therefore, there exists a need for a technical solution that solves the aforementioned problems of conventional techniques of allocating device instance IDs to various device instances of an I3C target device in I3C communication protocol.

SUMMARY

In one embodiment of the present disclosure, an improved inter-integrated circuit (I3C) target system coupled with an I3C controller device by way of an I3C interface is disclosed. The I3C target system includes a plurality of device instances of an I3C target device that are coupled with each other in series. A first device instance of the plurality of device instances is coupled with a second device instance of the plurality of device instances and the I3C controller device. The first device instance is configured to receive a first status signal that is indicative of a first device instance identifier (ID). The first device instance is further configured to receive a command and a clock signal from the I3C controller device, and decode the command based on the first status signal and the clock signal. Further, the first device instance is configured to generate and provide, to the I3C controller device, a response to the command based on the decoding of the command. The response includes the first device instance ID. The first device instance is further configured to receive from the I3C controller device a first dynamic address that is allocated to the first device instance. Further, the first device instance is configured to generate and provide, upon receiving the first dynamic address, a second status signal to the second device instance. The second status signal is generated based on the first status signal and the clock signal, and is indicative of a second device instance ID of the second device instance. Based on the second device instance ID, a second dynamic address is allocated by the I3C controller device to the second device instance.

In another embodiment of the present disclosure, an electronic circuit board is disclosed. The electronic circuit board includes an improved inter-integrated circuit (I3C) controller device, an I3C interface, and a plurality of device instances of an I3C target device that are coupled with each other in series, and further coupled with the I3C controller device by way of the I3C interface. A first device instance of the plurality of device instances is coupled with a second device instance of the plurality of device instances and the I3C controller device. The first device instance is configured to receive a first status signal that is indicative of a first device instance identifier (ID). The first device instance is further configured to receive a command and a clock signal from the I3C controller device, and decode the command based on the first status signal and the clock signal. Further, the first device instance is configured to generate a response to the command based on the decoding of the command, and provide the response to the I3C controller device. The response includes the first device instance ID. The first device instance is further configured to receive, from the I3C controller device, a first dynamic address that is allocated to the first device instance. Further, the first device instance is configured to generate a second status signal upon receiving the first dynamic address, and provide the second status signal to the second device instance. The second status signal is generated based on the first status signal and the clock signal, and is indicative of a second device instance ID of the second device instance. A second dynamic address is allocated by the I3C controller device to the second device instance based on the second device instance ID.

In some embodiments, the first device instance ID corresponds to a number of negative edges of the first status signal, and the second device instance ID corresponds to a number of negative edges of the second status signal. The second device instance ID is greater than the first device instance ID by one.

In some embodiments, the I3C interface includes a data bus and a clock bus. The first device instance receives the command and the first dynamic address from the I3C controller device and provides the response to the I3C controller device by way of the data bus. Further, the first device instance receives the clock signal from the I3C controller device by way of the clock bus.

In some embodiments, the command corresponds to an enter dynamic address assignment (ENTDAA) broadcast command associated with an I3C communication protocol. The first device instance decodes the command when the first status signal is in a deactivated state.

In some embodiments, the first device instance is further configured to generate and provide, upon receiving the first dynamic address, an acknowledgment signal to the I3C controller device. The second status signal is further generated based on the acknowledgment signal.

In some embodiments, the clock signal is halted after the response is provided to the I3C controller device and reactivated after the acknowledgment signal is provided to the I3C controller device.

In some embodiments, the first device instance includes first and second flip-flops (FFs). The first flip-flop (FF) has an input terminal that is configured to receive the first status signal, a control terminal that is configured to receive a power-on reset signal, a clock terminal that is configured to receive a delayed power-on reset signal, and an output terminal that is configured to output a first FF output signal. The second FF has an input terminal that is configured to receive a reference signal, a control terminal that is configured to receive the power-on reset signal, a clock terminal that is configured to receive the first status signal, and an output terminal that is configured to output a second FF output signal. The clock terminals of the first and second FFs are positive and negative clock terminals, respectively. Further, the output terminals of the first and second FFs are negative and positive output terminals, respectively.

In some embodiments, the first device instance further includes a delay element that is configured to receive the power-on reset signal, and generate the delayed power-on reset signal.

In some embodiments, the first device instance further includes an up counter that is configured to receive the first status signal, and generate a count. The count is incremented during each negative edge of the first status signal.

In some embodiments, the first device instance further includes a processing circuit that is coupled with the I3C controller device and the up counter, and configured to receive the command and the clock signal from the I3C controller device, and the count from the up counter. The count corresponds to the first device instance ID of the first device instance. Further, the processing circuit is configured to decode the command based on the clock signal, and generate and provide, to the I3C controller device, the response to the command based on the decoding of the command. The processing circuit is further configured to receive the first dynamic address from the I3C controller device, and generate and provide the acknowledgment signal to the I3C controller device upon receiving the first dynamic address.

In some embodiments, the first device instance further includes a first logic gate having first and second input terminals that are coupled with the output terminals of the first and second FFs, and configured to receive the first and second FF output signals, respectively. The first logic gate further has an output terminal that is coupled with the processing circuit, and configured to output and provide a first control signal to the processing circuit to control an operation of the processing circuit.

In some embodiments, the first device instance further includes a second logic gate having first and second input terminals that are coupled with the output terminal of the second FF and the processing circuit, and configured to receive the second FF output signal and the acknowledgment signal, respectively. The second logic gate further has an output terminal that is coupled with the up counter, and configured to output and provide a second control signal to the up counter to control an operation of the up counter. The first and second input terminals of the second logic gate are positive and negative input terminals, respectively.

In some embodiments, the first device instance further includes a pulse generator that is coupled with the I3C controller device, the processing circuit, the up counter, and the second device instance. The pulse generator is configured to receive the clock signal, the first acknowledgment signal, and the count, generate the second status signal based on the clock signal, the first acknowledgment signal, and the count, and provide the second status signal to the second device instance.

Various embodiments of the present disclosure disclose dynamic address allocation of a plurality of device instances of an improved inter-integrated circuit (I3C) target device. The plurality of device instances are coupled with each other in series, and further coupled with an I3C controller device by way of an I3C interface. A first device instance of the plurality of device instances is configured to receive a command associated with the dynamic address allocation and a clock signal from the I3C controller device by way of the I3C interface. The first device instance is further configured to receive a first status signal that is indicative of a first device instance identifier (ID) of the first device instance. Further, the first device instance is configured to decode the command based on the clock signal when the first status signal is in a deactivated state. Based on the decoding of the command, the first device instance is further configured to generate and provide a response including the first device instance ID to the I3C controller device. The first device instance is then configured to receive a first dynamic address that is allocated to the first device instance from the I3C controller device, and generate and provide, based on the first status signal and the clock signal, a second status signal to the second device instance. The second status signal is indicative of a second device instance ID of the second device instance, and a second dynamic address is allocated by the I3C controller device to the second device instance based on the second device instance ID.

Thus, each device instance of the plurality of device instances is allocated a unique device instance ID by way of a status signal. The device instance ID allocation of each device instance is executed by way of two input/output (I/O) pins (i.e., one for receiving a status signal from a serially coupled device instance, and another for providing a status signal to another serially coupled device instance). Further, after the successful dynamic address allocation of each device instance, such I/O pins may be utilized for one or more functional operations of the corresponding device instance. Thus, a need for reserving four dedicated pins on each device instance for device instance ID allocation is eliminated. As a result, a size and a manufacturing cost of each device instance are significantly less than that of a conventional device instance on which four dedicated pins are reserved for device instance ID allocation. Consequently, a size and a manufacturing cost of a printed circuit board (PCB) that includes the plurality of device instances of the present disclosure are significantly less than that of a PCB including conventional device instances.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
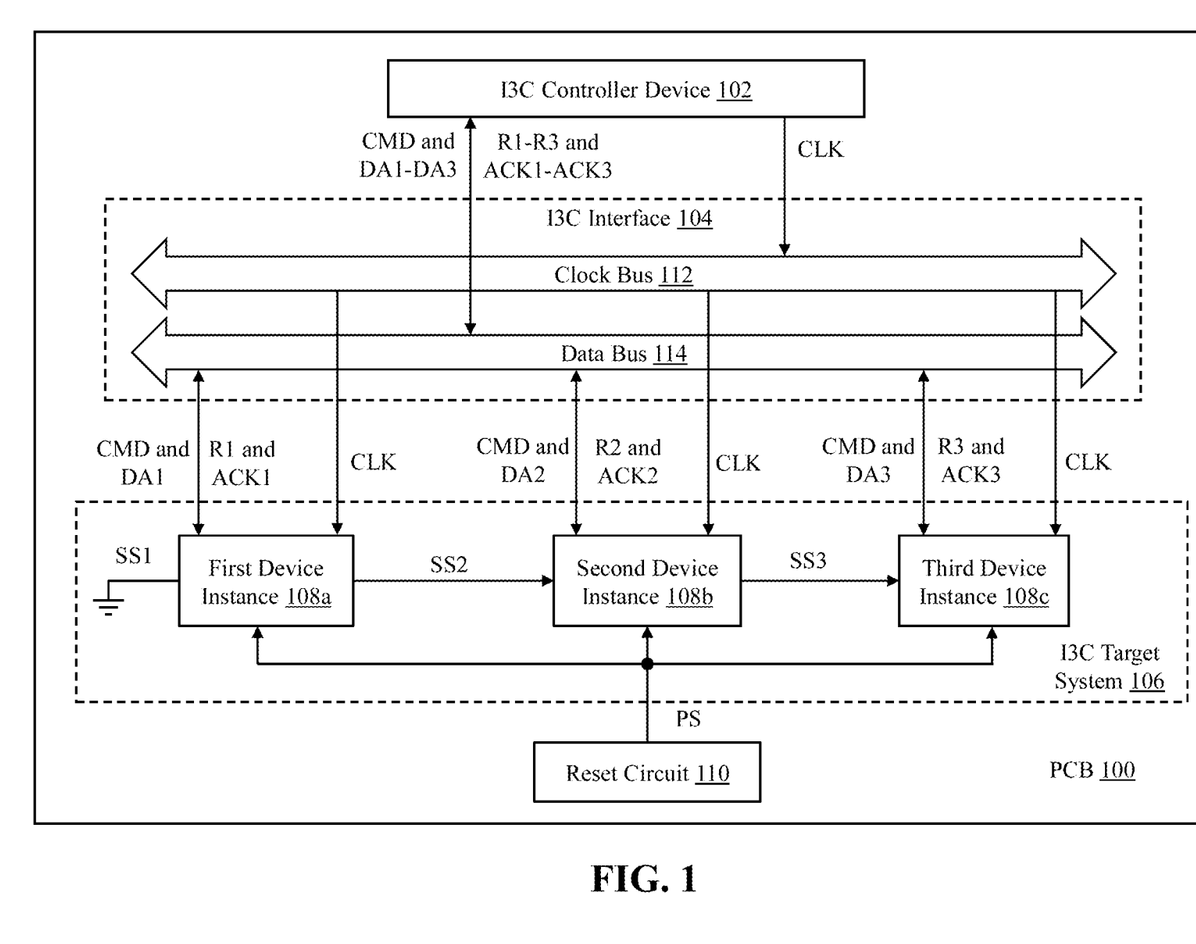
FIG. 1 illustrates a schematic block diagram of a printed circuit board (PCB) in accordance with an embodiment of the present disclosure.

FIG. 1 illustrates a schematic block diagram of a printed circuit board (PCB) 100 in accordance with an embodiment of the present disclosure. The PCB 100 is an electronic circuit board that includes an improved inter-integrated circuit (I3C) controller device 102, an I3C interface 104, and an I3C target system 106 coupled with the I3C controller device 102 by way of the I3C interface 104. The I3C target system 106 includes a plurality of device instances of an I3C target device of which first through third device instances 108a-108c of the I3C target device are shown. The PCB 100 further includes a reset circuit 110. The PCB 100 may be included in computing systems, network systems, automotive systems, or the like.

The I3C controller device 102 is coupled with the I3C interface 104. The I3C controller device 102 may include suitable logic, circuitry, interfaces, and/or code, executable by the circuitry, that may be configured to perform one or more operations. For example, the I3C controller device 102 is configured to establish, by way of the I3C interface 104, an I3C communication with the plurality of device instances (i.e., the first through third device instances 108a-108c).

To establish the I3C communication, the I3C controller device 102 is further configured to generate and provide a command CMD to the first through third device instances 108a-108c by way of the I3C interface 104. The command CMD corresponds to an enter dynamic address assignment (ENTDAA) broadcast command associated with an I3C communication protocol defined by Mobile Industry Processor Interface (MIPI) Alliance. Further, the I3C controller device 102 is configured to generate and provide a clock signal CLK to the first through third device instances 108a-108c by way of the I3C interface 104.

In response to the command CMD, the I3C controller device 102 is further configured to receive, by way of the I3C interface 104, first through third responses R1-R3 from the first through third device instances 108a-108c, respectively. The first through third responses R1-R3 are generated by the first through third device instances 108a-108c based on the decoding of the command CMD, respectively. The I3C controller device 102 receives the first through third responses R1-R3 in an asynchronous manner. For the sake of ongoing discussion, it is assumed that the I3C controller device 102 receives the second response R2 after the reception of the first response R1, and prior to the reception of the third response R3.

The first through third responses R1-R3 include first through third provisional IDs (not shown) of the first through third device instances 108a-108c, respectively. Each provisional ID of the first through third provisional IDs has 48 bits, and includes a 15-bit manufacturer ID, a 1-bit part ID, a 16-bit device ID, and a 12-bit version ID. The 15-bit manufacturer ID, the 16-bit device ID, and the 12-bit version ID correspond to an identifier of the manufacturer of the I3C target device, an identifier of the I3C target device, and a version of the I3C target device, respectively. Further, the 1-bit part ID indicates whether the associated provisional ID is a random number. In an example, when the first through third provisional IDs correspond to non-random numbers, the associated 1-bit part IDs are "0". As the first through third device instances 108a-108c are three instances of the same I3C target device, the 15-bit manufacturer ID, the 1-bit part ID, the 16-bit device ID, and the 12-bit version ID remain same for each provisional ID of the first through third provisional IDs.

The remaining 4 bits of the 48-bit provisional ID correspond to a device instance ID of an associated device instance. The 4-bit device instance ID in each of the first through third provisional IDs is thus different, thereby rendering the first through third provisional IDs unique. The first through third provisional IDs thus include first through third device instance IDs (not shown) of the first through third device instances 108a-108c, respectively, that are unique.

Each provisional ID of the first through third provisional IDs may further include a characteristic ID (not shown) of the corresponding device instance. The characteristic ID has 16-bits, and includes an 8-bit bus characteristic ID that is indicative of bus characteristics of the I3C target device, and an 8-bit device characteristic ID that is indicative of one or more functionalities of the I3C target device. As the first through third device instances 108a-108c are three instances of the same I3C target device, the 16-bit characteristic ID remains same for each provisional ID of the first through third provisional IDs. Thus, the first through third device instances 108a-108c are uniquely identifiable by way of the first through third responses R1-R3 (i.e., the first through third device instance IDs), respectively.

Upon receiving the first through third responses R1-R3, the I3C controller device 102 is further configured generate and allocate first through third dynamic addresses DA1-DA3 to the first through third device instances 108a-108c, respectively. As the I3C controller device 102 receives the second response R2 after the reception of the first response R1 and prior to the reception of the third response R3, the second device instance 108b is allocated a dynamic address (i.e., the second dynamic address DA2) after the dynamic address allocation of the first device instance 108a and prior to the dynamic address allocation of the third device instance 108c. In the I3C communication protocol, the dynamic address allocation by the I3C controller device 102 enables the establishment of the I3C communication between the first through third device instances 108a-108c and the I3C controller device 102 after the I3C interface 104 is initialized. Further, after the reception of each response of the first through third responses R1-R3, the I3C controller device 102 is further configured to halt the clock signal CLK.

In response to the first through third dynamic addresses DA1-DA3, the I3C controller device 102 is further configured to receive first through third acknowledgment signals ACK1-ACK3 from the first through third device instances 108a-108c, respectively. The first through third acknowledgment signals ACK1-ACK3 are indicative of successful dynamic address allocation of the first through third device instances 108a-108c, respectively. It will be apparent to a person skilled in the art that the dynamic address allocation of the second device instance 108b is initiated exclusively after the reception of the first acknowledgment signal ACK1 (i.e., after the first dynamic address DA1 is successfully allocated to the first device instance 108a). Further, upon receiving each acknowledgment signal of the first through third acknowledgment signals ACK1-ACK3, the I3C controller device 102 is further configured to reactivate the clock signal CLK.

The I3C interface 104 adheres to the I3C communication protocol, and is configured to facilitate the establishment of the I3C communication between the I3C controller device 102 and the first through third device instances 108a-108c. The I3C interface 104 includes clock and data buses 112 and 114 that are coupled between the I3C controller device 102 and the first through third device instances 108a-108c. The clock bus 112 is configured to receive the clock signal CLK from the I3C controller device 102, and provide the clock signal CLK to the first through third device instances 108a-108c. Similarly, the data bus 114 is configured to receive the command CMD from the I3C controller device 102, and provide the command CMD to the first through third device instances 108a-108c. The data bus 114 is further configured to receive the first through third responses R1-R3 from the first through third device instances 108a-108c, respectively, and provide the first through third responses R1-R3 to the I3C controller device 102.

When the I3C controller device 102 initiates the dynamic address allocation of the first through third device instances 108a-108c, the data bus 114 is further configured to receive the first through third dynamic addresses DA1-DA3 from the I3C controller device 102, respectively. The I3C controller device 102 is further configured to provide the first through third dynamic addresses DA1-DA3 to the first through third device instances 108a-108c, respectively. Upon the successful allocation of each of the first through third dynamic addresses DA1-DA3, the data bus 114 is further configured to receive the corresponding first through third acknowledgment signals ACK1-ACK3 from the first through third device instances 108a-108c, respectively. The data bus 114 is further configured to provide the first through third acknowledgment signals ACK1-ACK3 to the I3C controller device 102.

The first through third device instances 108a-108c of the I3C target system 106 are coupled with each other in series such that the second device instance 108b is coupled between the first and third device instances 108a and 108c. The first through third device instances 108a-108c are further coupled with the reset circuit 110, and configured to receive a power-on reset signal PS. In an embodiment, when the power-on reset signal PS is deactivated (i.e., is at a logic low state), the first through third device instances 108a-108c are reset (i.e., are non-operational). Further, when the power-on reset signal PS is activated (i.e., is at a logic high state), the first through third device instances 108a-108c are operational. When the first through third device instances 108a-108c are operational, the first through third device instances 108a-108c are configured to receive, from the I3C controller device 102 by way of the clock and data buses 112 and 114, the clock signal CLK and the command CMD, respectively. The first through third device instances 108a-108c are further configured to receive first through third status signals SS1-SS3, respectively.

The first through third status signals SS1-SS3 are indicative of the first through third device instance IDs of the first through third device instances 108a-108c, respectively. For example, the first through third device instance IDs are equal to a number of negative edges of the first through third status signals SS1-SS3, respectively. In an embodiment, a voltage level of the first status signal SS1 is equal to a ground voltage (i.e., the first status signal SS1 is deactivated). In other words, the first device instance 108a (i.e., an input terminal of the first device instance 108a) is coupled with a ground terminal. In such a scenario, a value of the first device instance ID is the least among the first through third device instance IDs. In an example, as each provisional ID has four bits that are indicative of a device instance ID, the first device instance ID is equal to "0000" (i.e., equal to the number of negative edges of the first status signal SS1). Consequently, the second and third status signals SS2 and SS3 have non-zero number of negative edges. In an embodiment, the number of negative edges of the second status signal SS2 is greater than that of the first status signal SS1 by one, and the number of negative edges of the third status signal SS3 is greater than that of the second status signal SS2 by one. Hence, the second device instance ID is greater than the first device instance ID by one, and the third device instance ID is greater than the second device instance ID by one. Thus, the second and third device instance IDs are equal to "0001" and "0002", respectively.

The first through third device instances 108a-108c are further configured to decode the command CMD based on the first through third status signals SS1-SS3, respectively, and the clock signal CLK, and generate and provide, based on the decoding of the command CMD, the first through third responses R1-R3 to the I3C controller device 102 by way of the data bus 114, respectively. At any instance, exclusively one device instance of the first through third device instances 108a-108c decodes the command CMD and generates the corresponding response. In an embodiment, the device instance with the associated status signal in a deactivated state (i.e., a logic low state) decodes the command CMD and generates the corresponding response. As the first status signal SS1 is deactivated, the first device instance 108a decodes the command CMD instantaneously. While the first device instance 108a is decoding the command CMD, the second and third device instances 108b and 108c remain idle. Based on the decoding of the command CMD, the first device instance 108a generates and provides the first response R1 to the I3C controller device 102 by way of the data bus 114. The first response R1 includes the first provisional ID (i.e., the first device instance ID) and the characteristic ID.

Upon providing the first response R1 to the I3C controller device 102, the clock signal CLK is halted and the first dynamic address DA1 is allocated to the first device instance 108a by the I3C controller device 102. The first device instance 108a is thus further configured to receive the first dynamic address DA1 from the I3C controller device 102 by way of the data bus 114. Upon reception of the first dynamic address DA1, the first device instance 108a is further configured to generate and provide the first acknowledgment signal ACK1 to the I3C controller device 102 by way of the data bus 114 to indicate the successful dynamic address allocation of the first device instance 108a. In an embodiment, the first device instance 108a activates the first acknowledgment signal ACK1 (i.e., generates the first acknowledgment signal ACK1 at a logic high state) to indicate the successful dynamic address allocation of the first device instance 108a.

Upon providing the first acknowledgment signal ACK1 to the I3C controller device 102, the clock signal CLK is reactivated. In such a scenario, the first device instance 108a is further configured to generate and provide, based on the first status signal SS1 and the clock signal CLK, the second status signal SS2 to the second device instance 108b. The second status signal SS2 is generated such that the number of negative edges of the second status signal SS2 is greater than the number of negative edges of the first status signal SS1 by one. The device instance ID allocation of the first device instance 108a is thus executed by way of two input/output (I/O) pins, i.e., one for receiving the first status signal SS1, and another for providing the second status signal SS2 to the second device instance 108b. After the successful dynamic address allocation of the first device instance 108a, such I/O pins may be utilized for one or more functional operations of the first device instance 108a. Further, upon the successful dynamic address allocation of the first device instance 108a, the command CMD is not decoded again by the first device instance 108a.

The command CMD is subsequently decoded by the second device instance 108b when the second status signal SS2 is in a deactivated state, and a corresponding response (i.e., the second response R2) is generated and provided by the second device instance 108b to the I3C controller device 102 by way of the data bus 114. The second response R2 includes the second provisional ID (i.e., the second device instance ID) and the characteristic ID. Upon providing the second response R2 to the I3C controller device 102, the clock signal CLK is halted and the second dynamic address DA2 is allocated to the second device instance 108b by the I3C controller device 102. The second device instance 108b is thus further configured to receive the second dynamic address DA2 from the I3C controller device 102 by way of the data bus 114, and in response, generate and provide the second acknowledgment signal ACK2 to the I3C controller device 102 by way of the data bus 114.

Upon providing the second acknowledgment signal ACK2 to the I3C controller device 102, the clock signal CLK is reactivated. The second device instance 108b is thus further configured to generate and provide, based on the second status signal SS2 and the clock signal CLK, the third status signal SS3 to the third device instance 108c. The third status signal SS3 is generated such that the number of negative edges of the third status signal SS3 is greater than the number of negative edges of the second status signal SS2 by one. The device instance ID allocation of the second device instance 108b is thus executed by way of two I/O pins, i.e., one for receiving the second status signal SS2 from the first device instance 108a, and another for providing the third status signal SS3 to the third device instance 108c. After the successful dynamic address allocation of the second device instance 108b, such I/O pins may be utilized for one or more functional operations of the second device instance 108b. Further, upon the successful dynamic address allocation of the second device instance 108b, the command CMD is not decoded again by the second device instance 108b.

The third device instance 108c then decodes the command CMD when the third status signal SS3 is in a deactivated state for a first time, and generates and provides the third response R3 to the I3C controller device 102 by way of the data bus 114. The third response R3 includes the third provisional ID (i.e., the third device instance ID) and the characteristic ID. Upon providing the third response R3 to the I3C controller device 102, the clock signal CLK is halted and the third dynamic address DA3 is allocated to the third device instance 108c by the I3C controller device 102. The third device instance 108c is thus further configured to receive the third dynamic address DA3 from the I3C controller device 102 by way of the data bus 114, and in response, generate and provide the third acknowledgment signal ACK3 to the I3C controller device 102 by way of the data bus 114.

Upon providing the third acknowledgment signal ACK3 to the I3C controller device 102, the clock signal CLK is reactivated. The third device instance 108c is thus further configured to generate, based on the third status signal SS3 and the clock signal CLK, a fourth status signal (not shown). Further, upon the successful dynamic address allocation of the third device instance 108c, the command CMD is not decoded again by the third device instance 108c. As the I3C target system 106 illustrated in FIG. 2 includes three device instances (i.e., the first through third device instances 108a-108c), the fourth status signal generated by the third device instance 108c may be provided to functional circuitry associated with the PCB 100 (not shown) to indicate the successful dynamic address allocation of all the plurality of device instances. The device instance ID allocation of the third device instance 108c is thus executed by way of two I/O pins, i.e., one for receiving the third status signal SS3 from the second device instance 108b, and another for providing the fourth status signal to the functional circuitry. After the successful dynamic address allocation of the third device instance 108c, such I/O pins may be utilized for one or more functional operations of the third device instance 108c.

It will be apparent to a person skilled in the art that the scope of the present disclosure is not limited to the I3C target system 106 exclusively including three device instances of the I3C target device (i.e., the first through third device instances 108a-108c of the I3C target device). In various other embodiments, the I3C target system 106 may include more than three device instances of one I3C target device (e.g., at most 16 device instances of one I3C target device), and one or more device instances of another I3C target device, without deviating from the scope of the present disclosure. In such a scenario, the dynamic address allocation of each device instance is similar to that described above.

The reset circuit 110 is coupled with the I3C target system 106 (i.e., first through third device instances 108a-108c), and configured to generate and provide the power-on reset signal PS to the I3C target system 106 to reset the I3C target system 106. In an embodiment, the power-on reset signal PS transitions from a deactivated state (i.e., a logic low state) to an activated state (i.e., a logic high state) during a power-up of the PCB 100.

Figure 2:
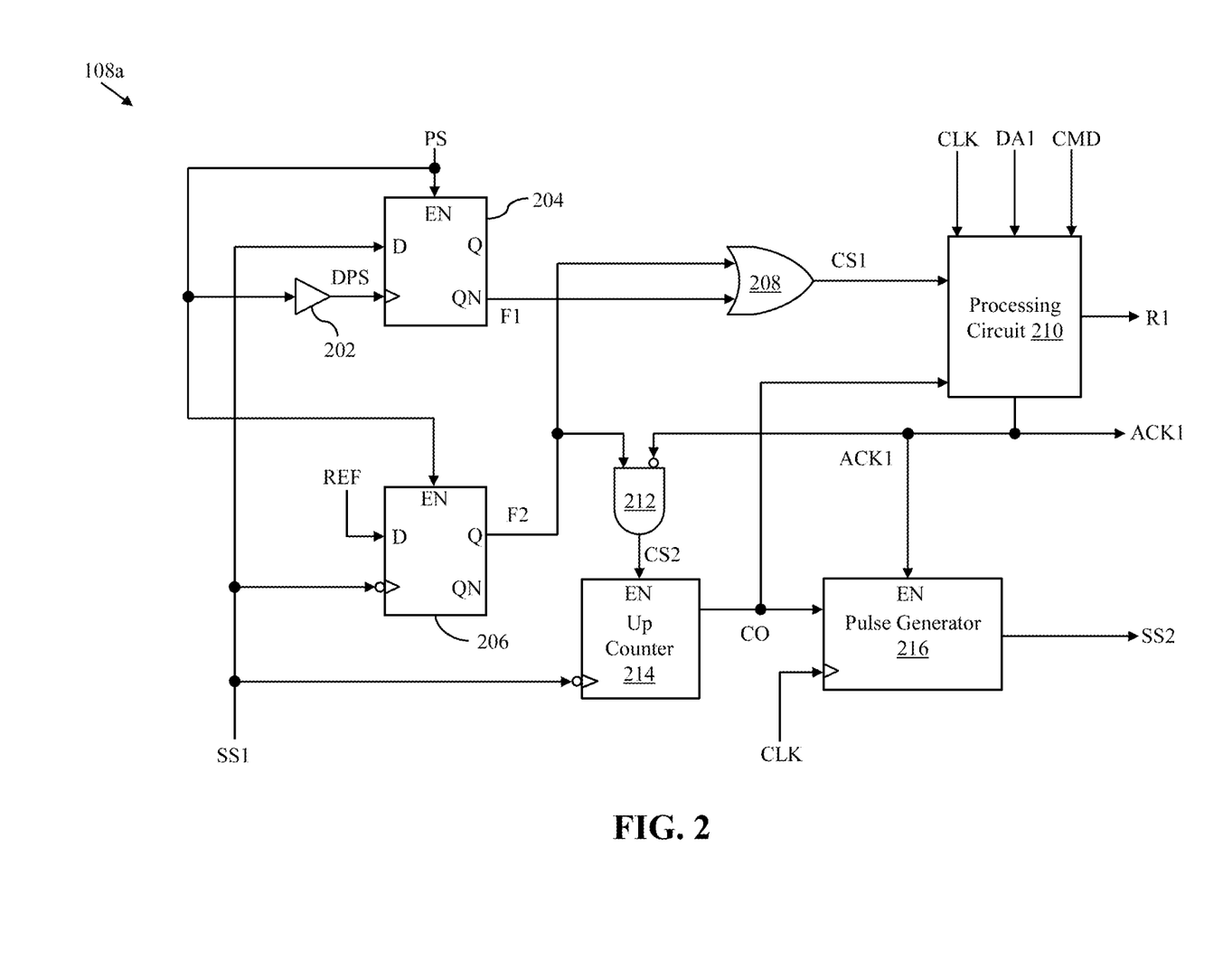
FIG. 2 illustrates a schematic circuit diagram of a first device instance of the PCB of FIG. 1 in accordance with an embodiment of the present disclosure.

FIG. 2 illustrates a schematic circuit diagram of the first device instance 108a in accordance with an embodiment of the present disclosure. The first device instance 108a includes a delay element 202 that is coupled with the reset circuit 110, and configured to receive the power-on reset signal PS, and generate a delayed power-on reset signal DPS. The first device instance 108a further includes first and second flip-flops (FFs) 204 and 206, a first logic gate 208, a processing circuit 210, a second logic gate 212, an up counter 214, and a pulse generator 216.

The first FF 204 has an input terminal that is configured to receive the first status signal SS1. The first FF 204 further has clock and control terminals that are coupled with the delay element 202 and the reset circuit 110, and configured to receive the delayed power-on reset signal DPS, and the power-on reset signal PS, respectively. In an embodiment, the clock terminal of the first FF 204 corresponds to a positive clock terminal. Further, the first FF 204 has an output terminal that is configured to output a first FF output signal F1. In an embodiment, the output terminal of the first FF 204 corresponds to a negative output terminal.

When the power-on reset signal PS is activated, the first FF 204 is operational and outputs the first FF output signal F1 at a positive edge of the delayed power-on reset signal DPS. In such a scenario, a logic state of the first FF output signal F1 is complementary of a logic state of the first status signal SS1. When the power-on reset signal PS is deactivated, the first FF 204 is reset (i.e., is non-operational). In such a scenario, the first FF output signal F1 may be deactivated (i.e., may be at a logic low state). In an embodiment, the first FF 204 is a D flip-flop. As the power-on reset signal PS transitions from a deactivated state to an activated state during the power-up of the PCB 100, the first FF output signal F1 indicates whether the corresponding device instance (i.e., the first device instance 108a) is an initial instance of the I3C target device (i.e., whether the corresponding device instance is coupled with the ground terminal). For example, as the first status signal SS1 is deactivated (i.e., as the voltage level of the first status signal SS1 is equal to the ground voltage), the first FF output signal F1 is activated, thereby indicating that the first device instance 108a is an initial instance of the I3C target device.

The second FF 206 has an input terminal that is coupled with a reference voltage generator (not shown), and configured to receive a reference signal REF. The reference voltage generator may be internal or external to the first device instance 108a. In an embodiment, the reference voltage generator generates the reference signal REF in an activated state (i.e., the reference signal REF is generated at a logic high state). The second FF 206 further has a clock terminal that is configured to receive the first status signal SS1, and a control terminal that is coupled with the reset circuit 110, and configured to receive the power-on reset signal PS. In an embodiment, the clock terminal of the second FF 206 corresponds to a negative clock terminal. Further, the second FF 206 has an output terminal that is configured to output a second FF output signal F2. In an embodiment, the output terminal of the second FF 206 corresponds to a positive output terminal.

When the power-on reset signal PS is activated, the second FF 206 is operational and outputs the second FF output signal F2 at a negative edge of the first status signal SS1. In such a scenario, a logic state of the second FF output signal F2 is same as that of the reference signal REF. When the power-on reset signal PS is deactivated, the second FF 206 is reset (i.e., is non-operational). In such a scenario, the second FF output signal F2 may be at a logic low state. In an embodiment, the second FF 206 is a D flip-flop. As the first status signal SS1 is deactivated, the transition from a deactivated state to an activated state is absent. As a result, the second FF output signal F2 may be outputted at a logic low state.

The first logic gate 208 has first and second input terminals that are coupled with the output terminals of the first and second FFs 204 and 206, and configured to receive the first and second FF output signals F1 and F2, respectively. In an embodiment, the first and second input terminals of the first logic gate 208 correspond to positive input terminals. The first logic gate 208 further has an output terminal that is coupled with the processing circuit 210, and configured to output and provide a first control signal CS1 to the processing circuit 210 to control an operation of the processing circuit 210. In an embodiment, the first control signal CS1 is activated (i.e., is at a logic high state) when one of the first and second FF output signals F1 and F2 are activated. Further, the first control signal CS1 is deactivated (i.e., is at a logic low state) when the first and second FF output signals F1 and F2 are deactivated. In an embodiment, the first logic gate 208 is an OR gate.

The processing circuit 210 is coupled with the I3C controller device 102, the output terminal of the first logic gate 208, and the up counter 214. The processing circuit 210 may include suitable logic, circuitry, interfaces, and/or code, executable by the circuitry, that may be configured to perform one or more operations. For example, the processing circuit 210 is configured to receive the first control signal CS1 from the output terminal of the first logic gate 208. The first control signal CS1 controls an operation of the processing circuit 210. In an embodiment, when the first control signal CS1 is deactivated, the processing circuit 210 is deactivated (i.e., the processing circuit 210 is non-operational). Further, when the first control signal CS1 is activated, the processing circuit 210 is activated (i.e., the processing circuit 210 is operational). When the processing circuit 210 is operational, the processing circuit 210 is configured to receive the command CMD and clock signal CLK from the I3C controller device 102 by the way the data and clock buses 114 and 112, respectively, and decode the command CMD based on the clock signal CLK. It will be apparent to a person skilled in the art that the processing circuit 210 decodes the command CMD in synchronization with the clock signal CLK.

The processing circuit 210 is further configured to receive a count CO from the up counter 214. The count CO is equal to a number of negative edges of a status signal (i.e., the first status signal SS1) received by the corresponding device instance (i.e., the first device instance 108a). In other words, the count CO corresponds to associated device instance ID (i.e., the first device instance ID). Based on the decoding of the command CMD, the processing circuit 210 is further configured to generate and provide the first response R1 to the I3C controller device 102 by way of the data bus 114. The first response R1 includes the first device instance ID which is equal to the count CO. The first response R1 further includes remaining portion of the first provisional ID and the characteristic ID.

Upon providing the first response R1 to the I3C controller device 102, the clock signal CLK is halted and the first dynamic address DA1 is allocated to the first device instance 108a by the I3C controller device 102. Thus, the processing circuit 210 is further configured to receive the first dynamic address DA1 from the I3C controller device 102 by way of the data bus 114. To indicate the successful dynamic address allocation of the first device instance 108a, the processing circuit 210 is further configured to generate and provide the first acknowledgment signal ACK1 to the I3C controller device 102 by way of the data bus 114. In an embodiment, prior to the successful dynamic address allocation of the first device instance 108a, the first acknowledgment signal ACK1 is deactivated, and upon the successful dynamic address allocation of the first device instance 108a, the first acknowledgment signal ACK1 is activated. Upon providing the first acknowledgment signal ACK1 to the I3C controller device 102, the clock signal CLK is reactivated.

The second logic gate 212 has first and second input terminals that are coupled with the output terminal of the second FF 206 and the processing circuit 210, and configured to receive the second FF output signal F2 and the first acknowledgment signal ACK1, respectively. In an embodiment, the first and second input terminals of the second logic gate 212 correspond to positive and negative input terminals, respectively. The second logic gate 212 further has an output terminal that is coupled with the up counter 214, and configured to output and provide a second control signal CS2 to the up counter 214 to control an operation of the up counter 214. In an embodiment, the second control signal CS2 is activated (i.e., is at a logic high state) when the second FF output signal F2 is activated (i.e., is at a logic high state) and the first acknowledgment signal ACK1 is deactivated (i.e., is at a logic low state). Conversely, the second control signal CS2 is deactivated (i.e., is at a logic low state) when the second FF output signal F2 is deactivated (i.e., is at a logic low state) or the first acknowledgment signal ACK1 is activated (i.e., is at a logic high state). As the first status signal SS1 is deactivated, the second control signal CS2 remains deactivated prior to and after the successful dynamic address allocation of the first device instance 108a. In one embodiment, the second logic gate 212 is an AND gate.

The up counter 214 is coupled with the output terminal of the second logic gate 212, and configured to receive the second control signal CS2. The second control signal CS2 controls an operation of the up counter 214. In an embodiment, when the second control signal CS2 is activated, the up counter 214 is activated (i.e., the up counter 214 is operational). When the up counter 214 is operational, the up counter 214 is configured to receive the first status signal SS1, and generate the count CO. The count CO is generated such that the count CO is at a predetermined value (e.g., "0") upon the activation of the up counter 214, and is subsequently incremented during each negative edge of the first status signal SS1. Further, when the second control signal CS2 is deactivated, the up counter 214 is deactivated (i.e., the up counter 214 is non-operational). In such a scenario, the count CO remains at the predetermined value (e.g., "0"), For the first device instance 108a, as the first status signal SS1 and the second control signal CS2 remains deactivated, the count CO remains at the predetermined value (i.e., "0"). The up counter 214 is further coupled with the processing circuit 210, and further configured to provide the count CO to the processing circuit 210 for generating the first response R1.

The pulse generator 216 is coupled with the processing circuit 210, up counter 214, and the second device instance 108b. Further, the pulse generator 216 is coupled with the I3C controller device 102 by way of the clock bus 112. The pulse generator 216 may include suitable logic, circuitry, interfaces, and/or code, executable by the circuitry, that may be configured to perform one or more operations. For example, the pulse generator 216 is configured to receive the first acknowledgment signal ACK1 from the processing circuit 210. The first acknowledgment signal ACK1 controls an operation of the pulse generator 216. In an embodiment, when the first acknowledgment signal ACK1 is deactivated, the pulse generator 216 is deactivated (i.e., the pulse generator 216 is non-operational). Further, when the first acknowledgment signal ACK1 is activated, the pulse generator 216 is activated (i.e., the pulse generator 216 is operational). As the first acknowledgment signal ACK1 is deactivated and activated prior to and after the successful dynamic address allocation of the first device instance 108a, respectively, the pulse generator 216 is non-operational and operational prior to and after the successful dynamic address allocation of the first device instance 108a, respectively.

When the pulse generator 216 is operational, the pulse generator 216 is configured to receive the count CO from the up counter 214 and the clock signal CLK from the I3C controller device 102 by way of the clock bus 112. The pulse generator 216 is further configured to generate, based on the count CO and the clock signal CLK, the second status signal SS2. It will be apparent to a person skilled in the art that the pulse generator 216 generates the second status signal SS2 in synchronization with the clock signal CLK. The second status signal SS2 is generated such that the number of negative edges of the second status signal SS2 is greater than the number of negative edges of the first status signal SS1 by one (i.e., greater than the count CO by one). The pulse generator 216 is further configured to provide the second status signal SS2 to the second device instance 108b for facilitating dynamic address allocation of the second device instance 108b.

It will be apparent to a person skilled in the art that the structure of the second and third device instances 108b and 108c is similar to the structure of the first device instance 108a as illustrated in FIG. 2. Further, as the second and third status signals SS2 and SS3 have one or more negative edges, when the second and third status signals SS2 and SS3 transition from an activated state to a deactivated state for the first time, a processing circuit (not shown) of each of the second and third device instances 108b and 108c is activated and functions in a similar manner as described above. Additionally, an up counter (not shown) of each of the second and third device instances 108b and 108c is activated and generates a corresponding count (not shown) that is incremented until the second acknowledgment signal ACK2 is activated. Thus, the count associated with each of the second and third device instances 108b and 108c is a non-zero value (e.g., "1" and "2", respectively). A pulse generator (not shown) of each of the second and third device instances 108b and 108c then generates the corresponding status signal (i.e., the third status signal SS3 and the fourth status signal, respectively) in a manner similar to the generation of the second status signal SS2.

In operation, when the PCB 100 is powered up, the I3C interface 104 is initialized and the I3C controller device 102 initiates the allocation of dynamic addresses for each device instance of the first through third device instances 108a-108c of the I3C target device. The I3C controller device 102 generates and provides the command CMD (i.e., the ENTDAA broadcast command) and the clock signal CLK to the first through third device instances 108a-108c by way of the data and clock buses 114 and 112, respectively.

During the power-up of the PCB 100, the first status signal SS1 is deactivated, and the second and third status signals SS2 and SS3 and the fourth status signal are activated. Further, the power-on reset signal PS transitions from a deactivated state to an activated state. Thus, the first FF 204 is operational. As the first status signal SS1 is deactivated, the first FF output signal F1 is activated. As a result, the processing circuit 210 is operational, and decodes the command CMD based on the clock signal CLK. Further, as the second control signal CS2 is deactivated, the count CO remains at the predetermined value. While the first device instance 108a is decoding the command CMD, the second and third device instances 108b and 108c remain idle. Based on the decoding of the command CMD, the processing circuit 210 generates the first response R1 that includes the first device instance ID of the first device instance 108a, and provides the first response R1 to the I3C controller device 102 by way of the data bus 114. Upon receiving the first response R1, the I3C controller device 102 halts the clock signal CLK. The I3C controller device 102 then generates and allocates the first dynamic address DA1 to the first device instance 108a.

The processing circuit 210 thus receives the first dynamic address DA1 from the I3C controller device 102 by way of the data bus 114. To indicate the successful dynamic address allocation of the first device instance 108a, the processing circuit 210 generates and provides the first acknowledgment signal ACK1 in an activated state to the I3C controller device 102 by way of the data bus 114. Upon reception of the first acknowledgment signal ACK1, the I3C controller device 102 reactivates the clock signal CLK. Further, the activated state of the first acknowledgment signal ACK1 activates the pulse generator 216 and deactivates the up counter 214. Based on the reactivated clock signal CLK and the count CO, the pulse generator 216 generates and provides the second status signal SS2 to the second device instance 108b.

The second status signal SS2 is generated such that the number of negative edges of the second status signal SS2 is greater than the number of negative edges of the first status signal SS1 by one. It will be apparent to a person skilled in the art that the dynamic address allocation of the second device instance 108b and the generation of the third status signal SS3 are similar to the dynamic address allocation of the first device instance 108a and the generation of the second status signal SS2, respectively, as described above. Further, as the second status signal SS2 has one negative edge, when the second status signal SS2 transitions from an activated state to a deactivated state, the processing circuit and the up counter of the second device instance 108b are activated. Consequently, the second device instance ID is determined, the second dynamic address DA2 is allocated to the second device instance 108b, and the third status signal SS3 is generated and provided to the third device instance 108c.

The third status signal SS3 is generated such that the number of negative edges of the third status signal SS3 is greater than the number of negative edges of the second status signal SS2 by one. It will be apparent to a person skilled in the art that the dynamic address allocation of the third device instance 108c and the generation of the fourth status signal are similar to the dynamic address allocation of the second device instance 108b and the generation of the third status signal SS3, respectively. Further, as the third status signal SS3 has two negative edges, when the second status signal SS2 transitions from an activated state to a deactivated state for the first time, the processing circuit and the up counter of the third device instance 108c are activated. Consequently, the third device instance ID is determined, the third dynamic address DA3 is allocated to the third device instance 108c, and the fourth status signal is generated.

Thus, each device instance of the plurality of device instances (i.e., the first through third device instances 108a-108c) is allocated a unique device instance ID by way of the corresponding status signal. Such device instance ID allocation of each device instance is executed by way of two I/O pins (i.e., one for receiving a status signal from a serially coupled device instance, and another for providing a status signal to another serially coupled device instance). Further, after the dynamic address allocation of each device instance, such I/O pins may be utilized for various functional operations of the corresponding device instance. As a result, a need for reserving four dedicated pins in each device instance for device instance ID allocation is eliminated. Hence, a size and a manufacturing cost of each device instance are significantly less than that of a conventional device instance on which four dedicated pins are reserved for the device instance ID allocation. Consequently, a size and a manufacturing cost of the PCB 100 are significantly less than that of a PCB including conventional device instances.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An improved inter-integrated circuit (I3C) target system coupled with an I3C controller device by way of an I3C interface, the I3C target system comprising:
a plurality of device instances of an I3C target device that are coupled with each other in series, wherein a first device instance of the plurality of device instances is coupled with a second device instance of the plurality of device instances and the I3C controller device, and wherein the first device instance is configured to:
receive a first status signal that is indicative of a first device instance identifier (ID) of the first device instance;
receive a command and a clock signal from the I3C controller device;
decode the command based on the first status signal and the clock signal;
generate and provide, to the I3C controller device, a response to the command based on the decoding of the command, wherein the response includes the first device instance ID;
receive, from the I3C controller device, a first dynamic address that is allocated to the first device instance; and
generate and provide, upon receiving the first dynamic address, a second status signal to the second device instance, wherein the second status signal is generated based on the first status signal and the clock signal, and is indicative of a second device instance ID of the second device instance, and wherein a second dynamic address is allocated by the I3C controller device to the second device instance based on the second device instance ID.

2. The I3C target system of claim 1, wherein the first device instance ID corresponds to a number of negative edges of the first status signal, and the second device instance ID corresponds to a number of negative edges of the second status signal, and wherein the second device instance ID is greater than the first device instance ID by one.

3. The I3C target system of claim 1, wherein the I3C interface includes a data bus and a clock bus, wherein the first device instance receives the command and the first dynamic address from the I3C controller device and provides the response to the I3C controller device by way of the data bus, and wherein the first device instance receives the clock signal from the I3C controller device by way of the clock bus.

4. The I3C target system of claim 1, wherein the command corresponds to an enter dynamic address assignment (ENTDAA) broadcast command associated with an I3C communication protocol, and wherein the first device instance decodes the command when the first status signal is in a deactivated state.

5. The I3C target system of claim 1, wherein the first device instance is further configured to generate and provide, upon receiving the first dynamic address, an acknowledgment signal to the I3C controller device, and wherein the second status signal is further generated based on the acknowledgment signal.

6. The I3C target system of claim 5, wherein the clock signal is halted after the response is provide to the I3C controller device, and reactivated after the acknowledgment signal is provided to the I3C controller device.

7. The I3C target system of claim 5, wherein the first device instance includes:
a first flip-flop (FF) that has:
an input terminal configured to receive the first status signal;

a control terminal configured to receive a power-on reset signal;
a clock terminal configured to receive a delayed power-on reset signal; and
an output terminal to output a first FF output signal; and
a second FF that has:
an input terminal configured to receive a reference signal;
a control terminal configured to receive the power-on reset signal;
a clock terminal configured to receive the first status signal; and
an output terminal configured to output a second FF output signal, wherein the clock terminals of the first and second FFs are positive and negative clock terminals, respectively, and the output terminals of the first and second FFs are negative and positive output terminals, respectively.

8. The I3C target system of claim 7, wherein the first device instance further includes a delay element that is configured to receive the power-on reset signal, and generate the delayed power-on reset signal.

9. The I3C target system of claim 7, wherein the first device instance further includes an up counter that is configured to receive the first status signal, and generate a count, and wherein the count is incremented during each negative edge of the first status signal.

10. The I3C target system of claim 9, wherein the first device instance further includes a processing circuit that is coupled with the I3C controller device and the up counter, and configured to:
receive the command and the clock signal from the I3C controller device;
receive the count from the up counter, wherein the count corresponds to the first device instance ID of the first device instance;
decode the command based on the clock signal;
generate and provide, to the I3C controller device, the response to the command based on the decoding of the command;
receive, from the I3C controller device, the first dynamic address; and
generate and provide, upon receiving the first dynamic address, the acknowledgment signal to the I3C controller device.

11. The I3C target system of claim 10, wherein the first device instance further includes a first logic gate having first and second input terminals that are coupled with the output terminals of the first and second FFs, and configured to receive the first and second FF output signals, respectively, and an output terminal that is coupled with the processing circuit, and configured to output and provide a first control signal to the processing circuit to control an operation of the processing circuit.

12. The I3C target system of claim 10, wherein the first device instance further includes a second logic gate having first and second input terminals that are coupled with the output terminal of the second FF and the processing circuit, and configured to receive the second FF output signal and the acknowledgment signal, respectively, and an output terminal that is coupled with the up counter, and configured to output and provide a second control signal to the up counter to control an operation of the up counter, and wherein the first and second input terminals of the second logic gate are positive and negative input terminals, respectively.

13. The I3C target system of claim 10, wherein the first device instance further includes a pulse generator that is coupled with the I3C controller device, the processing circuit, the up counter, and the second device instance, and configured to:
receive the clock signal, the acknowledgment signal, and the count;
generate the second status signal based on the clock signal, the acknowledgment signal, and the count; and
provide the second status signal to the second device instance.

14. An electronic circuit board, comprising:
an improved inter-integrated circuit (I3C) controller device;
an I3C interface; and
a plurality of device instances of an I3C target device that are coupled with each other in series, and further coupled with the I3C controller device by way of the I3C interface, wherein a first device instance of the plurality of device instances is coupled with a second device instance of the plurality of device instances and the I3C controller device, and wherein the first device instance is configured to:
receive a first status signal that is indicative of a first device instance identifier (ID) of the first device instance;
receive a command and a clock signal from the I3C controller device;
decode the command based on the first status signal and the clock signal;
generate and provide, to the I3C controller device, a response to the command based on the decoding of the command, wherein the response includes the first device instance ID;
receive, from the I3C controller device, a first dynamic address that is allocated to the first device instance; and
generate and provide, upon receiving the first dynamic address, a second status signal to the second device instance, wherein the second status signal is generated based on the first status signal and the clock signal, and is indicative of a second device instance ID of the second device instance, and wherein a second dynamic address is allocated by the I3C controller device to the second device instance based on the second device instance ID.

15. The electronic circuit board of claim 14, wherein the first device instance ID corresponds to a number of negative edges of the first status signal, and the second device instance ID corresponds to a number of negative edges of the second status signal, and wherein the second device instance ID is greater than the first device instance ID by one.

16. The electronic circuit board of claim 14, wherein the first device instance is further configured to generate and provide, upon receiving the first dynamic address, an acknowledgment signal to the I3C controller device, and wherein the second status signal is further generated based on the acknowledgment signal.

17. The electronic circuit board of claim 16, wherein the first device instance includes:
a first flip-flop (FF) that has:
an input terminal configured to receive the first status signal;
a control terminal configured to receive a power-on reset signal;
a clock terminal configured to receive a delayed power-on reset signal; and an output terminal configured to output a first FF output signal; and a second FF that has:
- an input terminal configured to receive a reference signal;
- a control terminal configured to receive the power-on reset signal;
- a clock terminal configured to receive the first status signal; and
- an output terminal configured to output a second FF output signal, wherein the clock terminals of the first and second FFs are positive and negative clock terminals, respectively, and the output terminals of the first and second FFs are negative and positive output terminals, respectively.

18. The electronic circuit board of claim 17, wherein the first device instance further includes:
- an up counter that is configured to receive the first status signal, and generate a count, wherein the count is incremented during each negative edge of the first status signal; and
- a processing circuit that is coupled with the I3C controller device and the up counter, and configured to:
  - receive the command and the clock signal from the I3C controller device;
  - receive the count from the up counter, wherein the count corresponds to the first device instance ID of the first device instance;
  - decode the command based on the clock signal;
  - generate and provide, to the I3C controller device, the response to the command based on the decoding of the command;
  - receive, from the I3C controller device, the first dynamic address; and
  - generate and provide, upon receiving the first dynamic address, the acknowledgment signal to the I3C controller device.

19. The electronic circuit board of claim 18, wherein the first device instance further includes:
- a first logic gate having first and second input terminals that are coupled with the output terminals of the first and second FFs, and configured to receive the first and second FF output signals, respectively, and an output terminal that is coupled with the processing circuit, and configured to output and provide a first control signal to the processing circuit to control an operation of the processing circuit; and
- a second logic gate having first and second input terminals that are coupled with the output terminal of the second FF and the processing circuit, and configured to receive the second FF output signal and the acknowledgment signal, respectively, and an output terminal that is coupled with the up counter, and configured to output and provide a second control signal to the up counter to control an operation of the up counter, wherein the first and second input terminals of the second logic gate are positive and negative input terminals, respectively.

20. The electronic circuit board of claim 18, wherein the first device instance further includes a pulse generator that is coupled with the I3C controller device, the processing circuit, the up counter, and the second device instance, and configured to:
- receive the clock signal, the acknowledgment signal, and the count;
- generate the second status signal based on the clock signal, the acknowledgment signal, and the count; and
- provide the second status signal to the second device instance.

* * * * *